US011245406B2

(12) United States Patent
Ranganathan et al.

(10) Patent No.: US 11,245,406 B2
(45) Date of Patent: Feb. 8, 2022

(54) METHOD FOR GENERATION OF INDEPENDENT CLOCK SIGNALS FROM THE SAME OSCILLATOR

(71) Applicant: Silicon Laboratories Inc., Austin, TX (US)

(72) Inventors: Harihara Subramanian Ranganathan, Round Rock, TX (US); Xue-Mei Gong, Austin, TX (US); James D. Barnette, Austin, TX (US); Nathan J. Shashoua, Austin, TX (US); Srisai Rao Seethamraju, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/917,828

(22) Filed: Jun. 30, 2020

(65) Prior Publication Data

US 2021/0409031 A1    Dec. 30, 2021

(51) Int. Cl.
*H03L 7/197* (2006.01)
*H03L 7/093* (2006.01)

(52) U.S. Cl.
CPC .......... *H03L 7/1974* (2013.01); *H03L 7/093* (2013.01)

(58) Field of Classification Search
None
See application file for complete search history.

(56) References Cited

U.S. PATENT DOCUMENTS

| 5,570,398 | A | * | 10/1996 | Smith | H03L 7/093 375/376 |
| 5,579,184 | A | * | 11/1996 | Nakanishi | G11B 20/1403 327/156 |
| 5,838,205 | A | * | 11/1998 | Ferraiolo | H03L 7/07 331/2 |
| 8,791,734 | B1 | | 7/2014 | Hara et al. | |
| 9,197,223 | B2 | * | 11/2015 | Matsumura | G01S 7/4056 |
| 9,762,250 | B2 | | 9/2017 | Perrott | |
| 9,793,904 | B1 | * | 10/2017 | Chenakin | H03K 5/1252 |
| 10,483,987 | B1 | | 11/2019 | Ranganathan et al. | |
| 10,608,647 | B1 | | 3/2020 | Ranganathan et al. | |

(Continued)

OTHER PUBLICATIONS

Silicon Labs, "Network Synchronizer Clocks Supporting 1 PPS to 750 MHz Inputs," Si5383/84 Rev D Data Sheet, Rev. 1.0, downloaded Feb. 7, 2019, 55 pages.

*Primary Examiner* — Lincoln D Donovan
*Assistant Examiner* — Khareem E Almo
(74) *Attorney, Agent, or Firm* — Zagorin Cave LLP

(57) ABSTRACT

A clock product includes a first phase-locked loop circuit including a first frequency divider. The first phase-locked loop circuit is configured to generate a first clock signal tracking a first reference clock signal and a second reference clock signal. The first phase-locked loop circuit is controlled by a first divide value and a first divide value adjustment based on the first reference clock signal. The clock product includes a circuit including a second frequency divider. The circuit is configured to generate a second clock signal based on the first clock signal, a second divide value, and a second divide value adjustment. The second clock signal tracks the second reference clock signal. The second divide value adjustment is based on the first divide value adjustment and opposes the first divide value adjustment.

22 Claims, 6 Drawing Sheets

(56) References Cited

U.S. PATENT DOCUMENTS

| | | | |
|---|---|---|---|
| 10,637,483 B2 | 4/2020 | Caffee et al. | |
| 2008/0238498 A1* | 10/2008 | Lam | H03L 7/16 327/117 |
| 2009/0189653 A1* | 7/2009 | Friend | H03L 7/08 327/156 |
| 2020/0177194 A1* | 6/2020 | Aouini | H03L 7/1976 |

* cited by examiner

METHOD FOR GENERATION OF INDEPENDENT CLOCK SIGNALS FROM THE SAME OSCILLATOR

BACKGROUND

Field of the Invention

The present invention relates to electronic devices and more particularly to generation of clock signals for electronic devices.

Description of the Related Art

In an exemplary application, a network of radios uses clock signals that are aligned to the same reference clock signal for time synchronization. In the same network, high speed data transfer over transmission lines could reference a different reference clock signal for time synchronization. A first set of clock signals tracks a high-speed data time reference clock signal for frequency stability and a time synchronization reference clock signal for tracking absolute time. Another output clock signal tracks the high-speed data time reference clock signal, but not the time synchronization reference clock signal. Techniques for generating those types of output clock signals that satisfy target phase noise specifications are desired.

SUMMARY OF EMBODIMENTS OF THE INVENTION

In at least one embodiment of the invention, a clock product includes a first phase-locked loop circuit including a first frequency divider. The first phase-locked loop circuit is configured to generate a first clock signal tracking a first reference clock signal and a second reference clock signal. The first phase-locked loop circuit is controlled by a first divide value and a first divide value adjustment based on the first reference clock signal. The clock product includes a circuit including a second frequency divider. The circuit is configured to generate a second clock signal based on the first clock signal, a second divide value, and a second divide value adjustment. The second clock signal tracks the second reference clock signal. The second divide value adjustment is based on the first divide value adjustment and opposes the first divide value adjustment.

In at least one embodiment of the invention, a method for generating clock signals includes generating a first clock signal tracking a first reference clock signal and a second reference clock signal by controlling a first phase-locked loop circuit including a first divider circuit using a first divide value and a first divide value adjustment based on the reference clock signal. The method includes generating a second clock signal based on the first clock signal, a second divide value, and a second divide value adjustment. The second clock signal tracks the second reference clock signal. The second divide value adjustment is based on the first divide value adjustment and opposes the first divide value adjustment.

In at least one embodiment of the invention, a method for generating clock signals includes generating a frequency-stabilized clock signal synchronous to a network clock signal and a second reference clock signal using a first divide value and a first divide value adjustment based on the second reference clock signal. The frequency-stabilized clock signal tracks a frequency of the second reference clock signal. The method includes filtering the frequency-stabilized clock signal to regenerate the network clock signal as an output network clock signal. The filtering uses a second frequency divider responsive to a second divide value modulated by a second divide value adjustment. The second divide value adjustment is based on the first divide value adjustment and opposes the first divide value adjustment.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
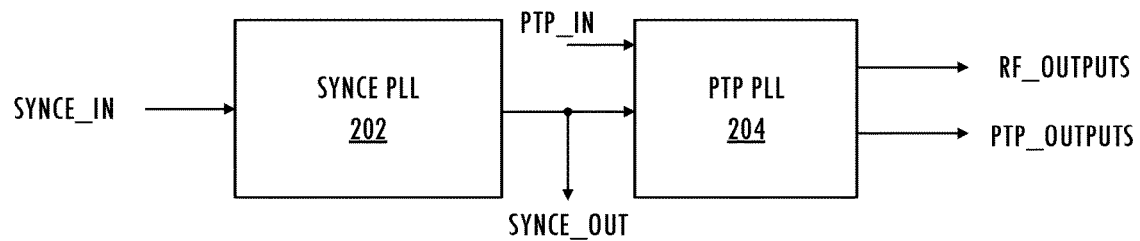
FIG. 1 illustrates a functional block diagram of a conventional clock generator including cascaded phase-locked loops.

A clock product includes a high-speed voltage-controlled oscillator (or an internal oscillator) that adjusts an input clock signal to track an absolute time reference clock signal. Output clock signals derived from the internal oscillator satisfy target phase noise performance specifications for time synchronization. Filtering of the internal oscillator signal reduces or eliminates effects of tracking adjustments on at least one other output clock signal. Thus, a single high-performance clock product generates multiple clock signals using the same oscillator, each of the multiple clock signals having a different time base and having phase noise performance that satisfies target specifications.

In general, data transport networks (e.g., Ethernet, broadcast video, wireless networks) are not required to communicate clock synchronization information. IEEE specification 1588-2008 Precision Time Protocol (PTP) and Synchronous Ethernet (SyncE) ITU-T Rec. G8262 are exemplary Timing over Packet (ToP) technologies for synchronizing clock frequency across devices in computing, wireline, and wireless networks and for improving clock accuracy to satisfy timing requirements of a target application.

For example, IEEE specification 1588-2008 PTP is a master/slave packet-based solution for synchronizing clock signals throughout a computing network based on message exchanges across a communications medium. A remote master clock can send timestamp information over data networks for synchronization by local clocks. Actual clock values (e.g., timestamps) are communicated inside payloads of special packets dedicated to the task. A grandmaster node (T-GM) traceable to a Coordinated Universal Time (UTC) source transmits synchronization information to the clocks residing on its network segment. Boundary clock nodes (T-BC) with a presence on that segment then relay accurate time to other segments to which they are also connected. Assisted Partial Timing Support (T-APTS) is an approach for timing in a wireless environment (e.g., Long Term Evolution standard, i.e., LTE) and is similar to the boundary clock implementation. T-APTS uses a UTC source, when available, to correct for network impairments in a PTP network. A clock product may be configured to comply with one or more of the T-GM, T-BC, or T-APTS specifications. PTP is a packet layer protocol that may be used to distribute frequency or phase information. A PTP system can deliver a phase signal in the form of one pulse per second and frequency information.

Synchronous Ethernet (SyncE) ITU-T Rec. G8262 describes timing characteristics of a synchronous equipment slave clock signal used in a master-slave method for distributing a frequency synchronization reference for synchronizing network equipment. SyncE uses the physical layer to distribute frequency from a primary reference clock to slaves. The SyncE clock provides an accurate frequency with high stability and low wander and can be used to synchronize radios in a wireless communications base station. However, SyncE does not provide a phase component. A network element may support domains compliant with each protocol. Wireless infrastructure solutions require synchronization of radio frequency interfaces to computing networks and regeneration of the SyncE clock signal to propagate a high stability low wander frequency reference throughout the network.

Referring to FIG. 1, an exemplary clock product regenerates a SyncE clock signal from input clock signal SYNCE_IN. SyncE phase-locked loop 202 removes jitter from input clock signal SYNCE_IN and regenerates the SyncE clock signal as output clock signal SYNCE_OUT. PTP phase-locked loop 204 generates radio frequency output signals and PTP output signals using clock signal PTP_IN and output clock signal SYNCE_OUT. Since output clock signal SYNCE_OUT and output clock signals RF_OUTPUTS and PTP_OUTPUTS may have different frequencies, to satisfy target specifications, the implementation of FIG. 1 uses two high frequency oscillators, which consumes substantial power, or uses multiple fractional frequency dividers, which can degrade jitter performance of the output clock signals.

Figure 2:
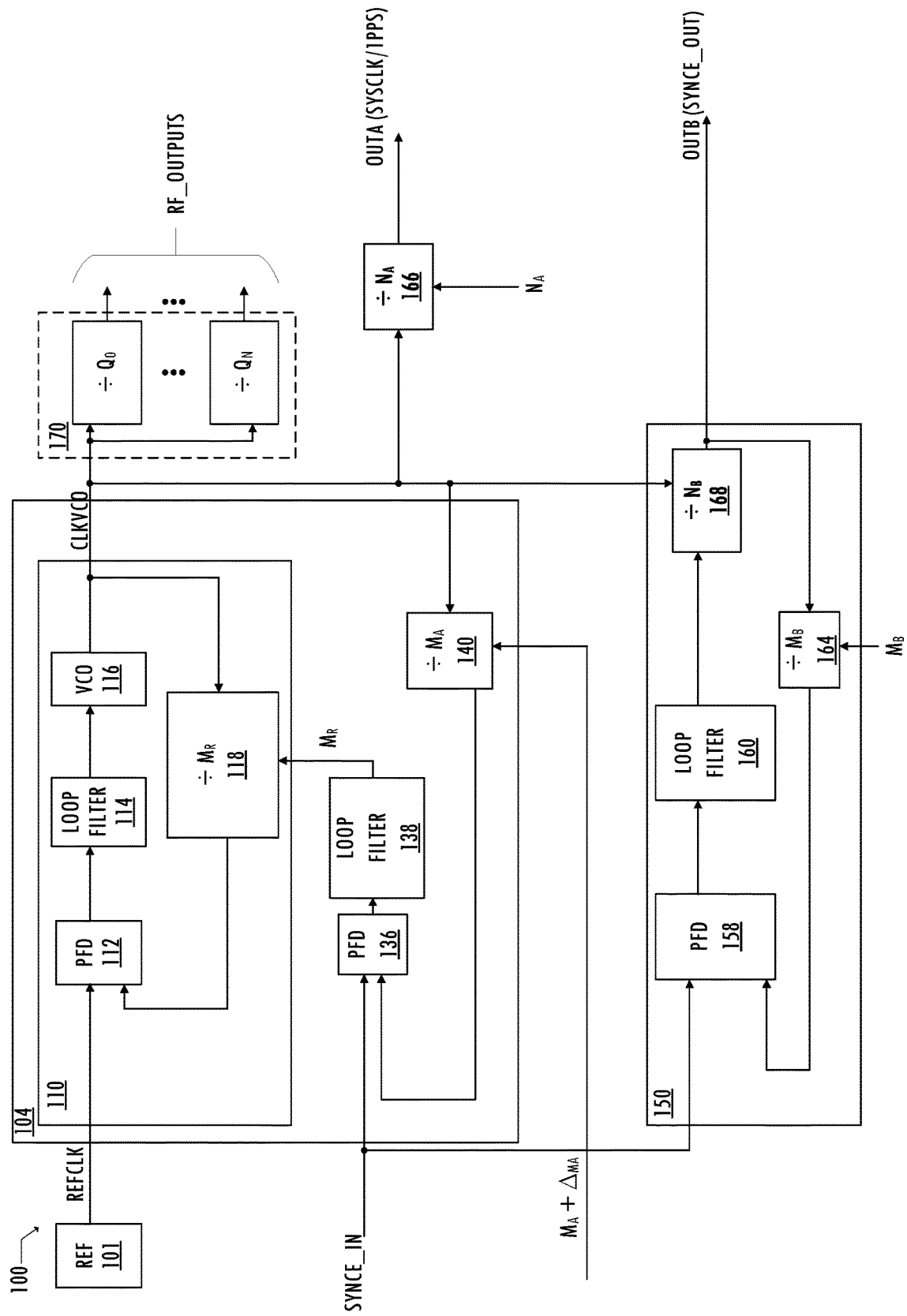
FIG. 2 illustrates a functional block diagram of an exemplary clock generator circuit including a nested phase-locked loop.

Referring to FIG. 2, rather than cascading phase-locked loops to generate output clock signals that are frequency stabilized with reference to clock signal PTP_IN (e.g., output clock signals RF_OUTPUTS and PTP_OUTPUTS), clock integrated circuit 100 nests phase-locked loop 110 within phase-locked loop 104 and uses phase-locked loop 150 to generate output clock signal OUTB (e.g., output clock signal SYNCE_OUT) using clock signal CLKVCO as a low jitter reference clock signal. In at least one embodiment, clock generator integrated circuit 100 includes a multi-loop phase-locked loop that generates clock signal CLKVCO having low jitter, by tracking clock signal SYNCE_IN and clock signal PTP_IN. Adjusted divide value $M_A+\Delta_{MA}$ is generated based on clock signal PTP_IN. In at least one embodiment, local reference clock signal REFCLK, provided by reference clock source 101, stabilizes clock signal CLKVCO in the absence of clock signal SYNCE_IN and clock signal PTP_IN. In other embodiments of clock generator integrated circuit 100, another type of controllable oscillator is used instead of phase-locked loop 110. Phase-locked loop 110 is an inner phase-locked loop that includes phase/frequency detector 112, loop filter 114, and voltage-controlled oscillator 116. Voltage controlled oscillator 116 may be implemented as a ring oscillator, an LC oscillator, or other suitable oscillator structure. Phase/frequency detector 112 receives the clock signal from reference clock source 101, which includes a fixed source such as a crystal oscillator, an oven-controlled crystal oscillator, a microelectromechanical structure (MEMS) oscillator, or other suitable low-jitter source. In at least one embodiment, phase-locked loop 110 is coupled to an innermost phase-locked loop (not shown) that locks to a local crystal oscillator.

Phase-locked loop 104 is an outer phase-locked loop that includes phase/frequency detector 136, loop filter 138, frequency divider 140 (e.g., a fractional divider), and uses inner phase-locked loop 110 as a digitally controlled oscillator for phase-locked loop 104. The digitally controlled oscillator is responsive to divider value $M_R$ which may be a fractional divide value provided by loop filter 138. Phase/frequency detector 136 receives clock signal SYNCE_IN and a feedback clock signal generated by frequency divider 140 and may be based on a frequency-divided version of clock signal CLKVCO. Phase/frequency detector 136 provides a phase error signal reflecting the difference between clock signal SYNCE_IN and the feedback clock signal. The frequency of clock signal CLKVCO is determined by the frequency of clock signal SYNCE_IN and the divider value $M_R$ provided by loop filter 138 and provided to frequency divider 118 (e.g., a fractional divider) in the feedback path of inner phase-locked loop 110. Phase-locked loop 104 adjusts divider value $M_R$ to match the frequency of clock signal CLKVCO to a multiple of the frequency of clock signal SYNCE_IN implemented using frequency divider 140 (e.g., frequency(SYNCE_IN)=frequency(CLKVCO)/$M_A$). Since divide value $M_A$ is adjusted based on clock signal PTP_IN, the frequency of clock signal CLKVCO also tracks clock signal PTP_IN.

Frequency divider 140 receives adjusted divide value $M_A+\Delta_{MA}$ (which is generated based on clock signal PTP_IN), configures phase-locked loop 104 as a digitally controlled oscillator compliant with the PTP standard protocol and stabilizes the frequency of clock signal CLKVCO for generating the PTP clock signals (e.g., output clock signals RF_OUTPUTS and PTP_OUTPUTS). Radio interface 170 (e.g., a common public radio interface) frequency-divides clock signal CLKVCO to generate output clock signals RF_OUTPUTS consistent with a target application. In at least one embodiment, another phase-locked loop (not shown) generates adjusted divide value $M_A+\Delta_{MA}$ and has a bandwidth an order of magnitude smaller than the bandwidth of phase-locked loop 104. In at least one embodiment, radio interface 170 uses high-performance integer dividers. Output divider 166 (e.g., a fractional divider) is configured to generate output clock signal OUTA, which satisfies target specifications (e.g., PTP).

In at least one embodiment, phase-locked loop 110 has a bandwidth in the range of 30 Hz-100 Hz. In at least one embodiment, phase-locked loop 104 has a bandwidth that is set according to the PTP standard protocol (e.g., 2 Hz-10 Hz) and phase-locked loop 150 has a bandwidth that is set with respect to the SyncE standard protocol (e.g., 0.2 Hz-1 Hz) to reject jitter on clock signal SYNCE_IN and to generate output clocks signal SYNCE_OUT with low phase noise (e.g., phase noise satisfying the SyncE standard protocol). In at least one embodiment, the bandwidth of phase-locked loop 104 is at least one order of magnitude less than (e.g., ten times smaller than) the bandwidth of phase-locked loop 150. However, divide value $M_A$ is modulated at a rate similar to the bandwidth of phase-locked loop 150 and thus, phase-locked loop 150 fails to filter out adjustments to divide value $M_A$ made to stabilize the frequency of clock signal CLKVCO by phase-locked loop 104, which may degrade jitter performance of output clock signal OUTB, e.g., causing output clock signal OUTB to be outside of SyncE standard protocol specifications (e.g., less than 0.2 dB peaking wander transfer).

Figure 3:
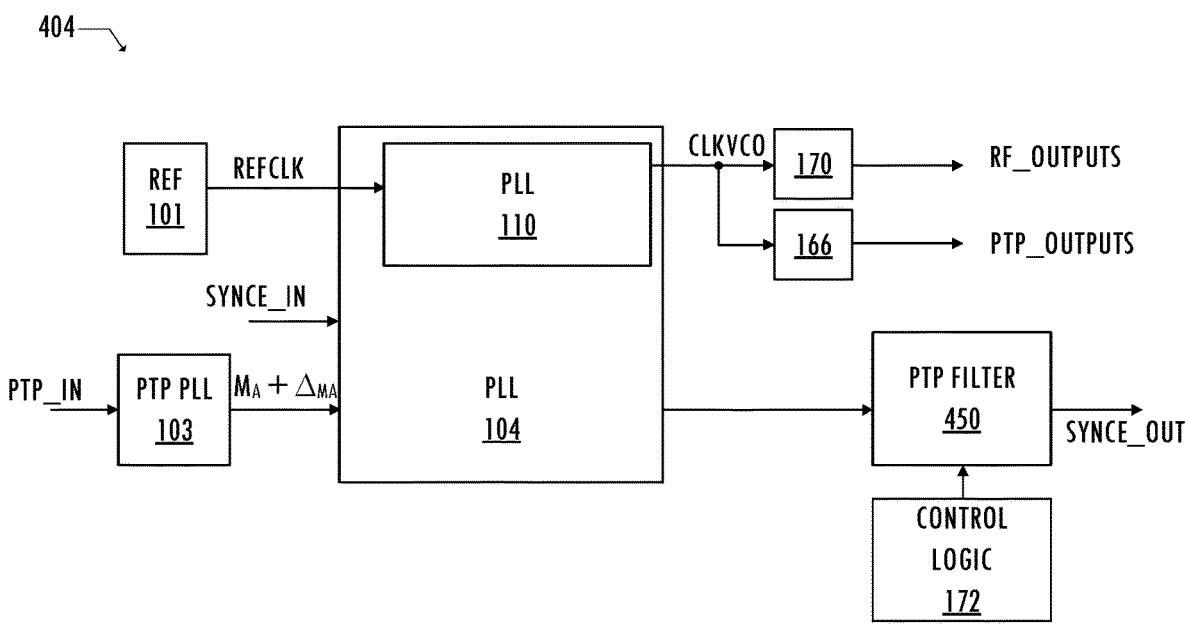
FIG. 3 illustrates a functional block diagram of an exemplary clock generator including a filter circuit configured to regenerate a reference clock signal from an internal clock signal generated by a nested phase-locked loop circuit consistent with at least one embodiment of the invention.

Referring to FIG. 3, in at least one embodiment, clock generator integrated circuit 404 includes a nested phase-locked loop architecture to generate frequency-stabilized outputs using clock signal PTP_IN. Clock generator integrated circuit 404 includes PTP filter 450 cascaded with the nested phase-locked loops to regenerate output clock signal SYNCE_OUT without effects of modulation of a divide value that is used to stabilize the frequency of an internal clock signal used to generate frequency-stabilized output clock signals RF OUTPUTS and PTP OUTPUTS. In at least one embodiment, clock generator integrated circuit 404 includes a multi-loop phase-locked loop that generates clock signal CLKVCO having low jitter by tracking clock signal SYNCE Ind. and a signal based on clock signal PTP Ind. For example, PTP phase-locked loop 103 provides an adjusted divide value $M_A+\Delta_{MA}$ generated based on clock signal PTP_IN. In at least one embodiment, phase-locked loop 110 receives reference clock signal REFCLK from reference clock source 101, which includes a fixed source such as a crystal oscillator, an oven-controlled crystal oscillator, a microelectromechanical structure (MEMS) oscillator, or other suitable low-jitter source. In at least one embodiment, phase-locked loop 110 is coupled to an inner-most phase-locked loop (not shown) that locks to a local crystal oscillator.

Phase-locked loop 104 is an outer phase-locked loop that uses inner phase-locked loop 110 as a digitally controlled oscillator. Phase-locked loop 104 receives adjusted divide value $M_A+\Delta_{MA}$, which is generated based on clock signal PTP_IN, configures phase-locked loop 104 as a digitally controlled oscillator compliant with the PTP standard protocol, and stabilizes the frequency of clock signal CLKVCO for generating the PTP clock signals (e.g., output clock signals RF_OUTPUTS and PTP_OUTPUTS). Radio interface 170 frequency-divides clock signal CLKVCO to generate output clock signals RF_OUTPUTS consistent with a target application. Output divider 166 (e.g., a fractional divider) is configured to generate clock signals that satisfy target specifications (e.g., PTP). In at least one embodiment, PTP filter 450 includes a fractional divider that receives updates from control logic 172, as described further below. In at least one embodiment, PTP filter 450 includes a fractional divider configured in a phase-locked loop. The phase-locked loop receives an adjusted divide value from control logic 172, as described further below. In at least one embodiment, the phase-locked loop of PTP filter 450 has the same bandwidth settings as phase-locked loop 104.

Clock generator integrated circuit 404 uses only one high frequency oscillator to generate both SyncE and PTP standard compliant output clock signals and performs integer frequency division of the high frequency oscillator. Clock generator integrated circuit 404 generates two independent output clock signals using the same high-frequency voltage-controlled oscillator. Thus, clock generator integrated circuit 404 achieves lower power consumption and cleaner frequency-stabilized RF and PTP clock signals than the clock generator integrated circuit of FIG. 1.

Figure 4:
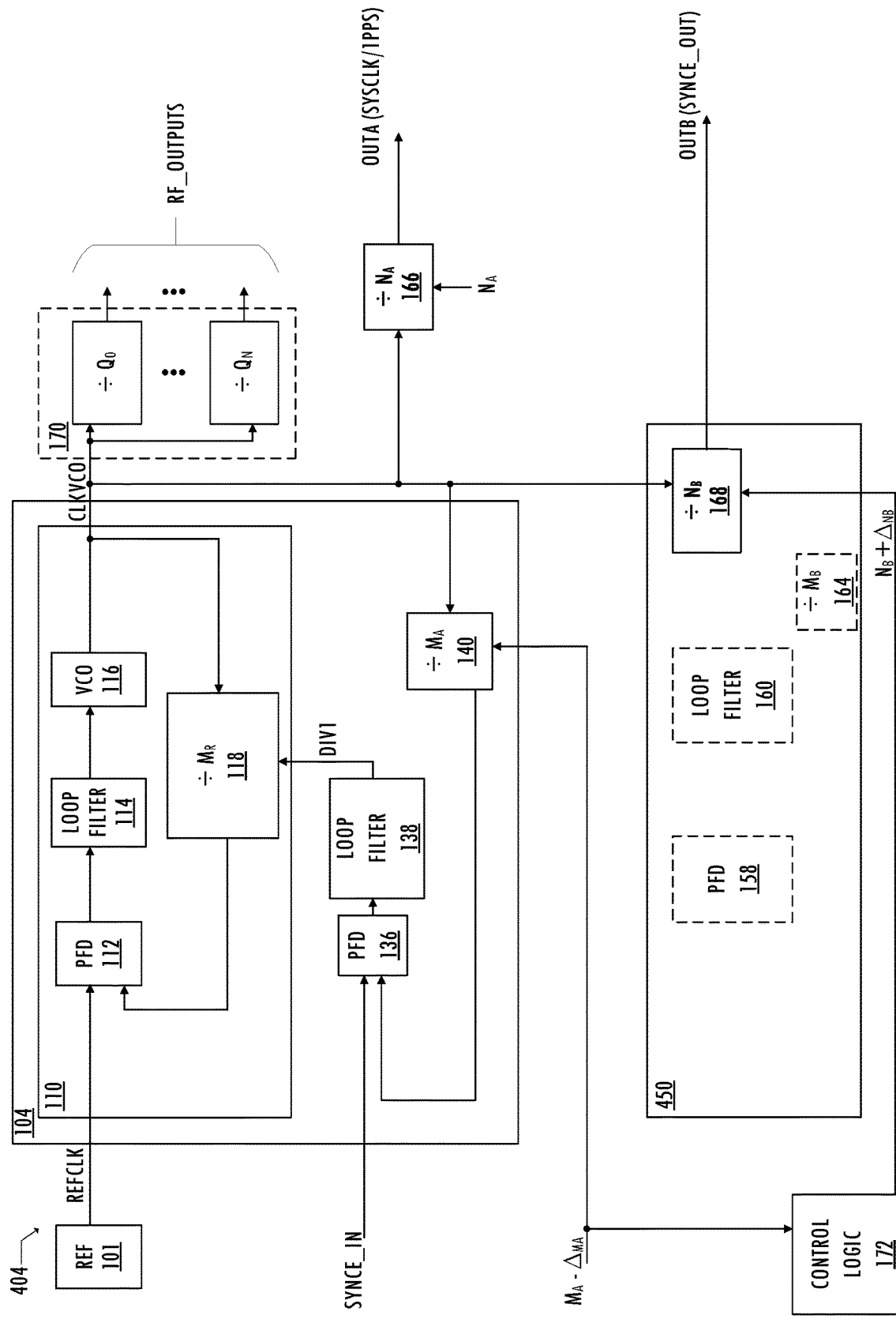
FIG. 4 illustrates a functional block diagram of an exemplary clock generator including a filter circuit implemented using a frequency divider responsive to an adjusted divider value generated based on adjustments to a feedback divider of a nested phase-locked loop consistent with at least one embodiment of the invention.

Referring to FIG. 4, in an exemplary embodiment, phase-locked loop 104 generates PTP clock signals (e.g., frequency-stabilized output clock signals OUTA and RF OUTPUTS) and PTP filter 450 generates output clock signal OUTB (e.g., output clock signal SYNCE_OUT). In at least one embodiment, PTP filter 450 includes only frequency divider 168. In other embodiments, PTP filter 450 is configured from a phase-locked loop circuit that includes disabled phase/frequency detector 158, loop filter 160, and frequency divider 164 (e.g., a fractional divider) and enabled frequency divider 168 (e.g., a fractional divider). In at least one embodiment of clock generator integrated circuit 404, phase-locked loop 104 responds to different step sizes of $\Delta_{MA}$ (e.g., 0.1 ppb to a few tens of ppm) with the same first order response and time constant, divide value $M_A$ is not drastically updated, e.g., by a PTP loop/1PPS loop (not shown). For example, any individual adjustment $\Delta_{MA}$ is less than +/−10 ppb, and phase noise performance is not substantially influenced by activity of the digitally controlled oscillator implemented using divider 140.

In at least one embodiment, frequency divider 168 receives clock signal CLKVCO and adjusted divide value $N_B+\Delta_{NB}$. Adjustment value $\Delta_{MA}$ that is used to modulate divide value $M_A$ is known by control logic 172 or is estimated by control logic 172 based on the adjusted divide value $M_A+\Delta_{MA}$. Control logic 172 uses adjustment value $\Delta_{MA}$, divide value $M_A$, and divide value NB to generate adjustment value $\Delta_{NB}$ for modulating divide value NB to provide modulation of output clock signal OUTB (i.e., the frequency-divided version of clock signal CLKVCO) that is equal and opposite to the modulation of CLKVCO. For example, if adjustment $\Delta_{MA}$ adjusts clock signal CLKVCO by an increase of 15 parts-per-billion (ppb) then control logic 172 generates a value of adjustment $\Delta_{NB}$ that adjusts output clock signal OUTB by a decrease of 15 ppb. However, output clock signal OUTB responds to adjustments to divide value NB faster than clock signal CLKVCO responds to adjustments to divide value $M_A$, which causes a phase error in output clock signal OUTB with respect to clock signal SYNCE_IN (e.g., approximately 0.5 fs/s per ppb of step size) and introduces a frequency error on the output clock signal. Frequency error on the output (FIG. 5) translates to a time interval error on output clock signal SYNCE_OUT as compared to clock signal SYNCE_IN (FIG. 6).

In at least one embodiment, divide value NB is adjusted using multiple increment steps (e.g., multiple updates of 1-3 ppb) to make the response of clock signal CLKVCO more gradual, like the response of OUTB.

Figure 5:
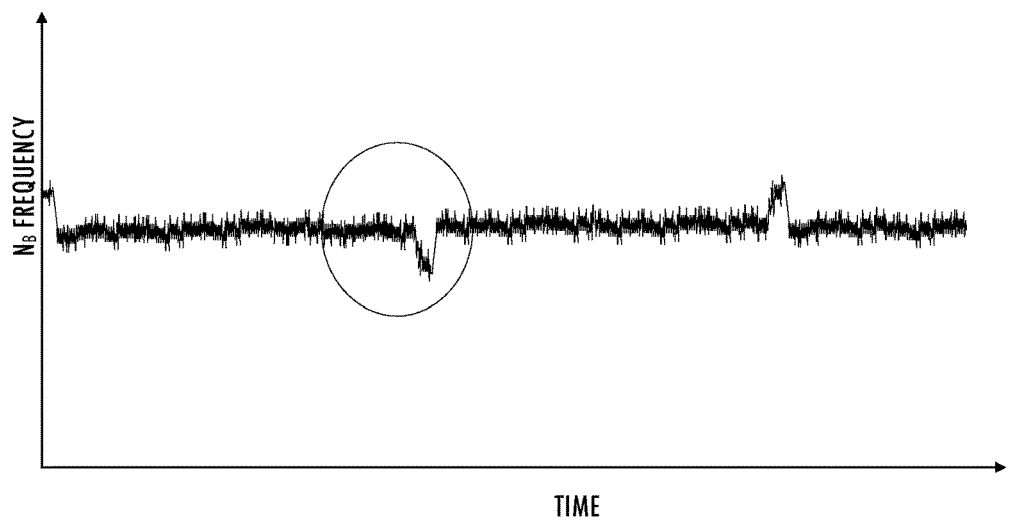
FIG. 5 illustrates an exemplary timing waveform for frequency error of a network clock signal regenerated by the clock generator of FIG. 4.
Figure 6:
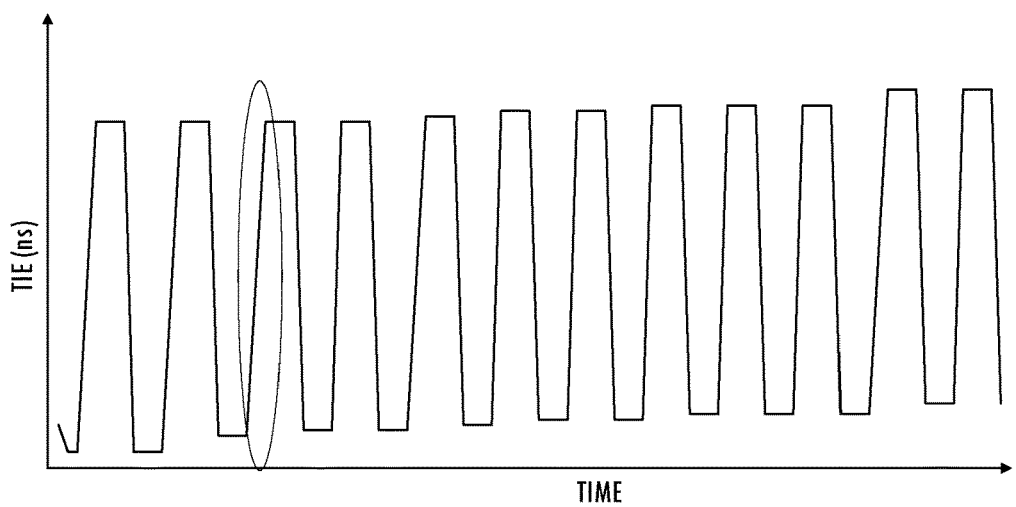
FIG. 6 illustrates an exemplary timing waveform for time interval error of network clock signal regenerated by the clock generator of FIG. 4.
Figure 7:
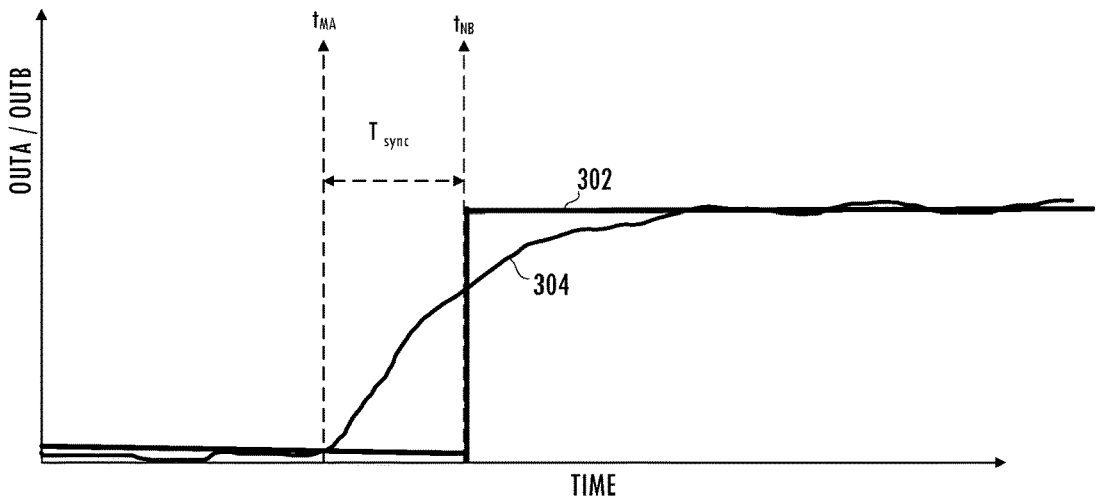
FIG. 7 illustrates exemplary timing waveforms for responses of output clock signals to modulation of divide values adjusted using a synchronization delay between adjustments to corresponding feedback dividers in phase-locked loops of FIG. 4.

Referring to FIGS. 4 and 7, in at least one embodiment, control logic 172 introduces a delay to adjustment of divide value NB to frequency divider 168 to counteract the update to divide value $M_A$ to reduce the time interval error from the time interval error of FIGS. 5 and 6. In at least one embodiment, control logic 172 triggers an update to frequency divider 140 at time $t_{MA}$ to generate response 304 and delays the update to divide value NB by time $T_{SYNC}$, and triggers the update to frequency divider 168 at time $t_{NB}$ to generate response 302 of frequency divider 168 that results in a zero net error in the phase of output clock signal OUTB from frequency divider 168. In at least one embodiment, control logic 172 includes a processor executing firmware that controls $T_{SYNC}$ between the updates to divide value $M_A$ and divide value $N_B$.

Figure 8:
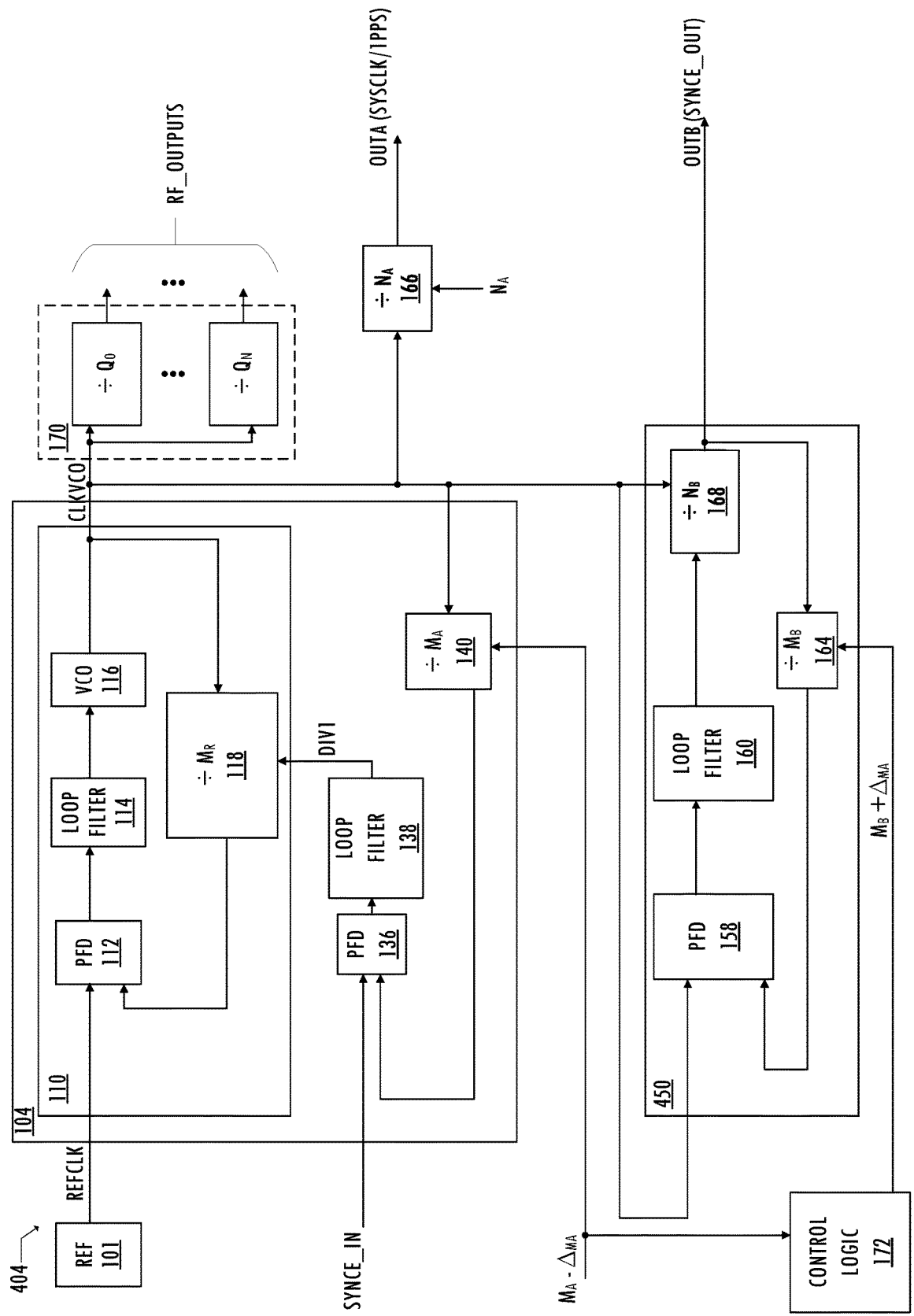
FIG. 8 illustrates a functional block diagram of an exemplary clock generator including a filter circuit implemented using a phase-locked loop circuit responsive to an internal clock signal and an adjusted divider value generated based on adjustments to a feedback divider of a nested phase-locked loop consistent with at least one embodiment of the invention.

Referring to FIGS. 3 and 8, in at least one embodiment of clock generator integrated circuit 404, rather than updating divide value $N_B$ at a time delayed from an update to divide value $M_A$, PTP filter 450 includes a phase-locked loop including phase-frequency detector 158, loop filter 160, frequency divider 168, and frequency divider 164, operatively coupled and configured to generate output clock signal OUTB using clock signal CLKVCO as an input reference clock signal. In at least one embodiment, the bandwidth of phase-locked loop 104 is the same as the bandwidth of phase-locked loop 450. In at least one embodiment, PTP filter 450 is implemented by configuring a phase-locked loop in a virtual holdover mode (i.e., a mode that uses an internally generated clock signal as the reference clock signal) that receives clock signal CLKVCO by phase/frequency detector 158 and generates divide value $N_B$ by loop filter 160, and uses frequency divider 168 to divide clock signal CLKVCO. Frequency divider 164 receives adjusted divide value $M_B+\Delta_{MB}$, which applies adjustment $\Delta_{MB}$ that causes a response that is approximately equal and opposite to the response of clock signal CLKVCO to adjustment $\Delta_{MA}$ for tracking input to generate output clock signal OUTB. Since the adjustment value $\Delta_{MA}$ used to modulate divide value $M_A$ is known by control logic 172 or is estimated by control logic 172 based on the adjusted divide value $M_A+\Delta_{MA}$, control logic 172 uses adjustment value $\Delta_{MA}$ to generate adjustment value $\Delta_{MB}$ for modulating $M_B$ to provide an equal and opposite modulation to output clock signal OUTB (i.e., the frequency-divided version of clock signal CLKVCO). In at least one embodiment, adjustment value $\Delta_{MB}$ has the same magnitude as adjustment value $\Delta_{MA}$. In other embodiments, control logic 172 determines adjustment value $\Delta_{MB}$ based on adjustment value $\Delta_{MA}$, divide value $M_A$, divide value $N_B$, and divide value $M_B$.

Figure 9:
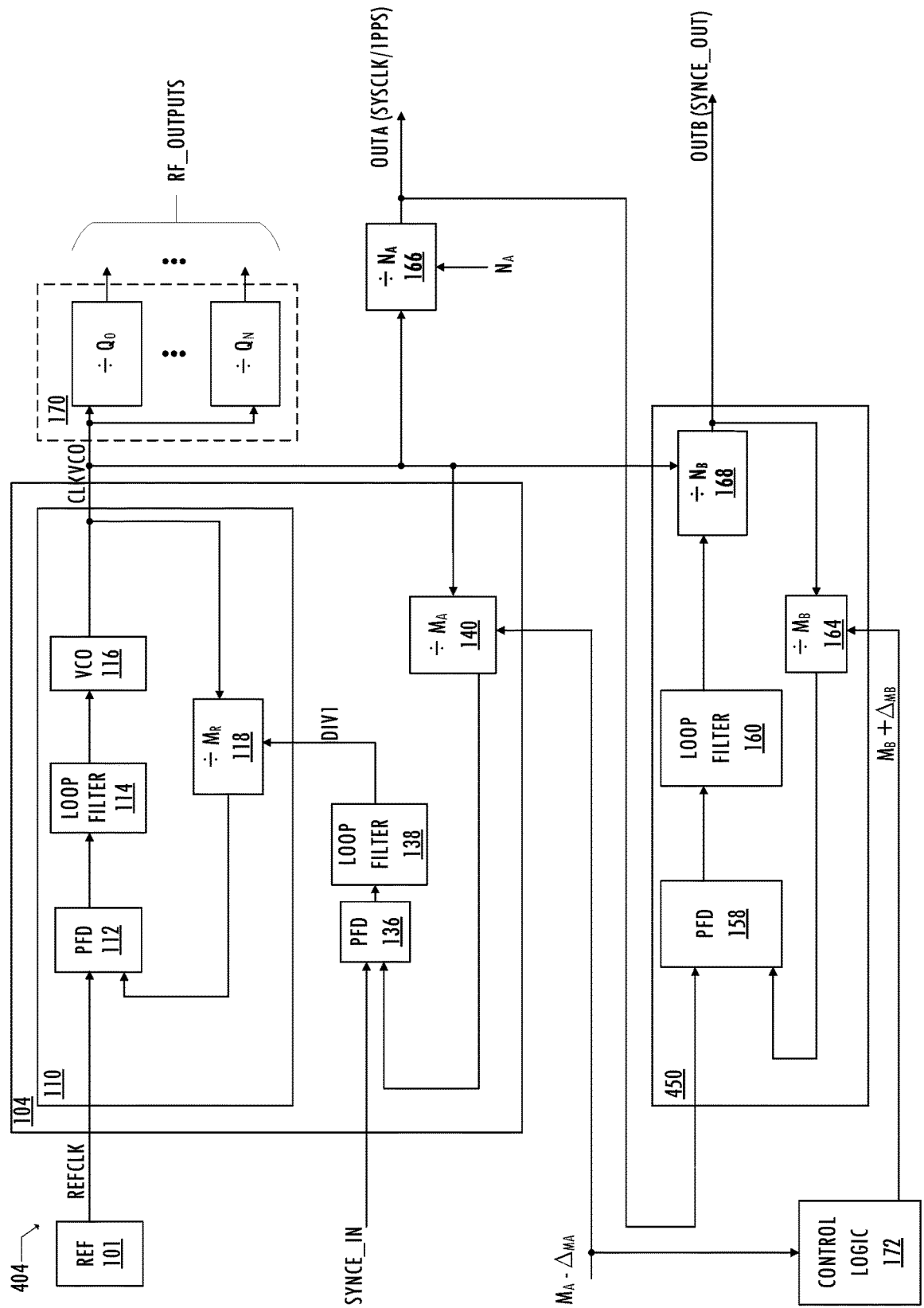
FIG. 9 illustrates a functional block diagram of an exemplary clock generator including a filter circuit implemented using a phase-locked loop circuit responsive to an output clock signal and an adjusted divider value generated based on adjustments to a feedback divider of a nested phase-locked loop consistent with at least one embodiment of the invention.

Referring to FIGS. 3 and 9, in at least one embodiment of clock generator integrated circuit 404, divider 166 generates output clock signal OUTA, which is provided as a reference clock signal to phase/frequency detector 158. In an embodiment of clock generator integrated circuit 404, output clock signal OUTA is coupled externally from an output terminal (e.g., pin) of clock generator integrated circuit 404 to an input terminal (e.g., pin) of clock generator integrated circuit 404, thereby cascading PTP filter 450 with phase-locked loop 104. In an alternative embodiment, clock generator integrated circuit 404 includes internal conductors that couple output clock signal OUTA as an input reference clock signal to phase/frequency detector 158. Control logic 172 adjusts divide value $M_B$ by adjustment $\Delta_{MB}$ that effectively adjusts the divide value by an amount that attenuates or eliminates the adjustments to divide value $M_A$ to generate output clock signal OUTB compliant with target specifications (e.g., SyncE standard protocol). The embodiments of FIGS. 8 and 9 have at most, negligible time interval error on the output clock signal OUTB SyncE output (e.g., time interval error in the range of –70 ps to 65 picoseconds, which is in the range of noise and is negligible in at least one application).

Thus, clock generation techniques that have improved jitter and reduced output spurs have been described. The clock generation techniques use only one high frequency oscillator to generate unique output clock signals and achieves lower power consumption and cleaner radio frequency and PTP clock signals (e.g., fewer spurs and reduced phase noise) than conventional clock generation techniques. The techniques generate frequency-stabilized output clock signal OUTA and output clock signals RF OUTPUTS that track clock signal CLKVCO, which is generated using a high-frequency oscillator. Output clock signal OUTB does not track clock signal CLKVCO although a reference clock signal used to generate output clock signal OUTB is derived from clock signal CLKVCO.

Although FIGS. 4, 8, and 9 describe embodiments in which analog signals are used, one of skill in the art will appreciate that the teachings herein can be utilized with digital signals. For example, in other embodiments, reference clock signal inputs and feedback clock signals are converted to digital representations (e.g., time stamps generated by time-to-digital converter circuits) and provided to digital phase/frequency detectors and digital loop filters.

Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

The description of the invention set forth herein is illustrative and is not intended to limit the scope of the invention as set forth in the following claims. For example, while the invention has been described in embodiments compliant with SyncE and PTP standard protocol specifications, techniques described herein can be adapted to generation of output clock signals compliant with other protocols. The terms "first," "second," "third," and so forth, as used in the claims, unless otherwise clear by context, is to distinguish between different items in the claims and does not otherwise indicate or imply any order in time, location or quality. For example, "a first received network signal," "a second received network signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A clock product comprising:
    a first phase-locked loop circuit including a first frequency divider, the first phase-locked loop circuit being configured to generate a first clock signal tracking a first reference clock signal and a second reference clock signal, the first phase-locked loop circuit being controlled by a first divide value and a first divide value adjustment based on the first reference clock signal; and
    a circuit including a second frequency divider, the circuit being configured to generate a second clock signal based on the first clock signal, a second divide value, and a second divide value adjustment, the second clock signal tracking the second reference clock signal, the second divide value adjustment being based on the first divide value adjustment and opposing an effect on the second clock signal of modulation of the first clock signal by the first divide value adjustment.

2. The clock product as recited in claim 1, wherein the first phase-locked loop circuit comprises:
    an inner phase-locked loop responsive to a local reference clock signal, the inner phase-locked loop including a controllable oscillator and a feedback divider responsive to a control signal; and
    an outer phase-locked loop comprising the first frequency divider, the outer phase-locked loop being configured to generate the control signal based on the second reference clock signal, the first clock signal, and the first divide value being modulated by the first divide value adjustment; and
    an output divider configured to generate a first output clock signal based on the first clock signal.

3. The clock product as recited in claim 1,
    wherein the first clock signal is used to generate frequency-stabilized output clock signals, and
    wherein the second clock signal is a regenerated version of the second reference clock signal.

4. The clock product as recited in claim 1, further comprising:
    a phase-locked loop configured to generate the first divide value adjustment; and
    control logic configured to generate the second divide value adjustment based on the first divide value adjustment.

5. The clock product as recited in claim 4, wherein the control logic comprises:
    a storage element configured to store instructions; and
    a processor configured to execute the instructions to cause the clock product to generate the second divide value.

6. The clock product as recited in claim 1,
    wherein the circuit comprises a second phase-locked loop configured to use the first clock signal as a reference clock signal, and
    wherein the second frequency divider is coupled to an output of the second phase-locked loop.

7. The clock product as recited in claim 1,
    wherein the circuit comprises a second phase-locked loop configured to use the first clock signal as a reference clock signal, and
    wherein a first bandwidth of the first phase-locked loop circuit is the same as a second bandwidth of the second phase-locked loop.

8. The clock product as recited in claim 1,
    wherein the circuit comprises a second phase-locked loop, and
    wherein the second frequency divider is included in a feedback path of the second phase-locked loop and the second phase-locked loop is configured in a virtual holdover mode or is cascaded with the first phase-locked loop circuit and the second frequency divider receives the second divide value adjusted by the second divide value adjustment.

9. The clock product as recited in claim 1 wherein the circuit is a filter coupled to receive a clock signal based on the first clock signal.

10. The clock product as recited in claim 1 wherein the first divide value adjustment is equal and opposite to the second divide value adjustment.

11. A method for generating clock signals comprising:
    generating a first clock signal tracking a first reference clock signal and a second reference clock signal by controlling a first phase-locked loop circuit including a first divider circuit using a first divide value and a first divide value adjustment based on the first reference clock signal; and
    generating a second clock signal based on the first clock signal, a second divide value, and a second divide value adjustment, the second clock signal tracking the second reference clock signal, the second divide value adjustment being based on the first divide value adjustment and opposing an effect on the second clock signal of modulation of the first clock signal by the first divide value adjustment.

12. The method as recited in claim 11,
    wherein generating the first clock signal comprises modulating the first divide value using the first divide value adjustment, and
    wherein generating the second clock signal comprises modulating the second divide value using the second divide value adjustment.

13. The method as recited in claim 11,
    wherein the first clock signal is used to generate frequency-stabilized output clock signals, and
    wherein the second clock signal is a regenerated version of the second reference clock signal.

14. The method as recited in claim 11 further comprising:
    generating the first divide value adjustment; and
    generating the second divide value adjustment based on the first divide value adjustment.

15. The method as recited in claim 11 wherein generating the second clock signal comprises:
    configuring a second phase-locked loop in a virtual holdover mode responsive to an internally generated clock signal based on the first clock signal;
    adjusting the second divide value by the second divide value adjustment to generate an adjusted second divide value; and
    providing the adjusted second divide value to a second divider circuit in a feedback path of the second phase-locked loop.

16. The method as recited in claim 15 wherein a first bandwidth of the first phase-locked loop circuit is the same as a second bandwidth of the second phase-locked loop.

17. The method as recited in claim 11 further comprising:
generating a first output clock signal based on the first clock signal and a fractional divide value,
wherein generating the second clock signal comprises:
adjusting the second divide value by the second divide value adjustment to generate an adjusted second divide value;
providing the adjusted second divide value to a second divider circuit in a feedback path of a second phase-locked loop circuit; and
providing the first output clock signal as an input to the second phase-locked loop circuit, thereby cascading the first phase-locked loop circuit with the second phase-locked loop circuit.

18. The method as recited in claim 11 wherein generating the second clock signal comprises:
adjusting the second divide value by the second divide value adjustment to generate an adjusted second divide value; and
frequency-dividing the first clock signal using the adjusted second divide value.

19. The method as recited in claim 18 wherein generating the second clock signal comprises:
delaying the adjusting of the second divide value by an interval sufficient to align the adjusting of the second divide value with the adjusting of the first divide value.

20. A method for generating clock signals comprising:
generating a frequency-stabilized clock signal synchronous to a network clock signal and a second reference clock signal using a first divide value and a first divide value adjustment based on the second reference clock signal, the frequency-stabilized clock signal tracking a frequency of the second reference clock signal; and
filtering the frequency-stabilized clock signal to regenerate the network clock signal as an output network clock signal, the filtering using a second frequency divider responsive to a second divide value modulated by a second divide value adjustment, the second divide value adjustment being based on the first divide value adjustment and opposing an effect on the second clock signal of modulation of the first clock signal by the first divide value adjustment.

21. The clock product as recited in claim 1 wherein the first frequency divider receives a control signal based on the first divide value and the first divide value adjustment and the second frequency divider receives a second control signal based on the second divide value and the second divide value adjustment.

22. The clock product as recited in claim 1 wherein modulation of the second clock signal by the second divide value adjustment is equal and opposite to the effect on the second clock signal of modulation of the first clock signal by the first divide value adjustment.

* * * * *